(12) United States Patent
Shen et al.

(10) Patent No.: US 9,252,764 B1
(45) Date of Patent: Feb. 2, 2016

(54) SYSTEMS AND METHODS FOR REDUCING SPIKE VOLTAGES IN A SWITCHED OUTPUT STAGE

(71) Applicant: Cirrus Logic, Inc., Austin, TX (US)

(72) Inventors: Dan Shen, Austin, TX (US); Lingli Zhang, Austin, TX (US); Johann Gaboriau, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 154 days.

(21) Appl. No.: 13/795,975

(22) Filed: Mar. 12, 2013

(51) Int. Cl.
*H03K 3/00* (2006.01)
*H03K 17/16* (2006.01)

(52) U.S. Cl.
CPC .................................. *H03K 17/165* (2013.01)

(58) Field of Classification Search
None
See application file for complete search history.

(56) References Cited

U.S. PATENT DOCUMENTS

| | | | |
|---|---|---|---|
| 4,096,398 A | | 6/1978 | Khaitan |
| 4,829,199 A | * | 5/1989 | Prater .............................. 326/27 |
| 4,855,623 A | * | 8/1989 | Flaherty .......................... 326/87 |
| 5,121,000 A | | 6/1992 | Naghshineh |
| 5,180,936 A | | 1/1993 | McDonald |
| 5,237,213 A | * | 8/1993 | Tanoi .............................. 327/205 |
| 5,450,019 A | | 9/1995 | McClure et al. |
| 5,877,647 A | | 3/1999 | Vajapey et al. |
| 6,018,256 A | * | 1/2000 | Kumagai et al. .............. 327/112 |
| 6,137,322 A | * | 10/2000 | Ten Eyck ....................... 327/112 |
| 6,265,915 B1 | | 7/2001 | Rider et al. |
| 6,366,129 B1 | * | 4/2002 | Douglas et al. ................. 326/86 |
| 6,373,300 B2 | * | 4/2002 | Welch et al. ................... 327/112 |
| 6,985,015 B2 | | 1/2006 | Ajit |
| 7,190,225 B2 | | 3/2007 | Edwards |
| 7,215,152 B2 | * | 5/2007 | Dubey ............................ 326/83 |
| 7,649,414 B2 | | 1/2010 | Kaya et al. |
| 7,746,155 B2 | | 6/2010 | Labbe |
| 7,973,523 B2 | | 7/2011 | Cheng |
| 8,085,081 B2 | * | 12/2011 | Ogawa et al. .................. 327/393 |
| 8,184,831 B2 | * | 5/2012 | Lin ................................. 381/123 |
| 8,872,561 B2 | | 10/2014 | Shen et al. |
| 2010/0067152 A1 | | 3/2010 | Nakahashi et al. |
| 2010/0164590 A1 | * | 7/2010 | Tsuji et al. ..................... 327/310 |
| 2010/0244930 A1 | * | 9/2010 | Ogawa et al. .................. 327/437 |
| 2012/0014025 A1 | | 1/2012 | Sato et al. |
| 2012/0268091 A1 | | 10/2012 | Takemae |

* cited by examiner

*Primary Examiner* — Lincoln Donovan
*Assistant Examiner* — Khareem E Almo
(74) *Attorney, Agent, or Firm* — Jackson Walker L.L.P.

(57) ABSTRACT

In accordance with embodiments of the present disclosure, an apparatus may include an input for indicating a characteristic of an output load current of a switched output stage comprising at least one driver device and a predriver circuit coupled to the input and a gate terminal of the at least one driver device, the predriver circuit for driving an input voltage signal to the gate terminal and configured to select an effective impedance of the gate terminal based on the input for indicating the output load current. In accordance with these and other embodiments of the disclosure, a method may include receiving an input for indicating a characteristic of an output load current of a switched output stage comprising at least one driver device and selecting an effective impedance of a gate terminal of the at least one driver device based on the input for indicating the output load current.

18 Claims, 2 Drawing Sheets

SYSTEMS AND METHODS FOR REDUCING SPIKE VOLTAGES IN A SWITCHED OUTPUT STAGE

FIELD OF DISCLOSURE

The present disclosure generally relates to an integrated circuit, and, more particularly, to systems and methods for reducing spike voltages in a switched output stage of an electronic circuit, for example a switched output stage of a power converter.

BACKGROUND

Many electronic devices on the market today often use power converters to convert electric energy from one form to another (e.g., converting between alternating current and direct current), amplifying a voltage or current of an electrical signal, modifying a frequency of an electrical signal, or some combination of the above. Examples of power converters may include boost converters, buck converters, and audio amplifiers (including, but not limited to Class D, and Class H amplifiers). Such power converters often employ a switched output stage, an example of which is shown in FIG. 1. In FIG. 1, switched output stage 100 comprises a pull-up device 102 (e.g., a switch, a p-type metal-oxide-semiconductor field effect transistor, etc.) coupled at its non-gate terminals between a supply voltage and an output node and a pull-down device 104 (e.g., a switch, an n-type metal-oxide-semiconductor field effect transistor, etc.) coupled at its non-gate terminals between a ground voltage and the output node. The gate terminals of each of the pull-up device and the pull-down device are typically driven by a pulse-width-modulated input voltage signal $v_{IN}$ (or a derivative thereof), and the switched output stage produces an output voltage signal $v_{OUT}$ on the output node which is a function of the input voltage signal.

One drawback in using switched output stages in a power converter is the presence of spikes (or overshoot) and ringing in the output voltage signal, as shown in FIG. 2. Such overshoot and subsequent ringing often occurs as a result of parasitic capacitances and inductances in the circuit resonating at their characteristic frequency, which decays over time due to resistances present in the circuit. For example, as output voltage signal $v_{OUT}$ transitions from a ground voltage to a supply voltage $V_{SUPPLY}$, $v_{OUT}$ may first overshoot $v_{SUPPLY}$ by an amount $v_{OVER}$, and then oscillates about $V_{SUPPLY}$ as the ringing decays. Overshoot and ringing may be undesirable as they may cause unneeded current to flow (e.g., thereby wasting energy and potentially causing undesirable heat), may delay arrival at a desired final state, and/or may cause communication of incorrect signals.

SUMMARY

In accordance with the teachings of the present disclosure, certain disadvantages and problems associated with output signal integrity of a switched output stage of an electronic circuit may be reduced or eliminated.

In accordance with embodiments of the present disclosure, an apparatus may include an input for indicating a characteristic of an output load current of a switched output stage comprising at least one driver device and a predriver circuit coupled to the input and a gate terminal of the at least one driver device, the predriver circuit for driving an input voltage signal to the gate terminal and configured to select an effective impedance of the gate terminal based on the input for indicating the output load current.

In accordance with these and other embodiments of the present disclosure, a method may include receiving an input for indicating a characteristic of an output load current of a switched output stage comprising at least one driver device and selecting an effective impedance of a gate terminal of the at least one driver device based on the input for indicating the output load current.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are example and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 3:
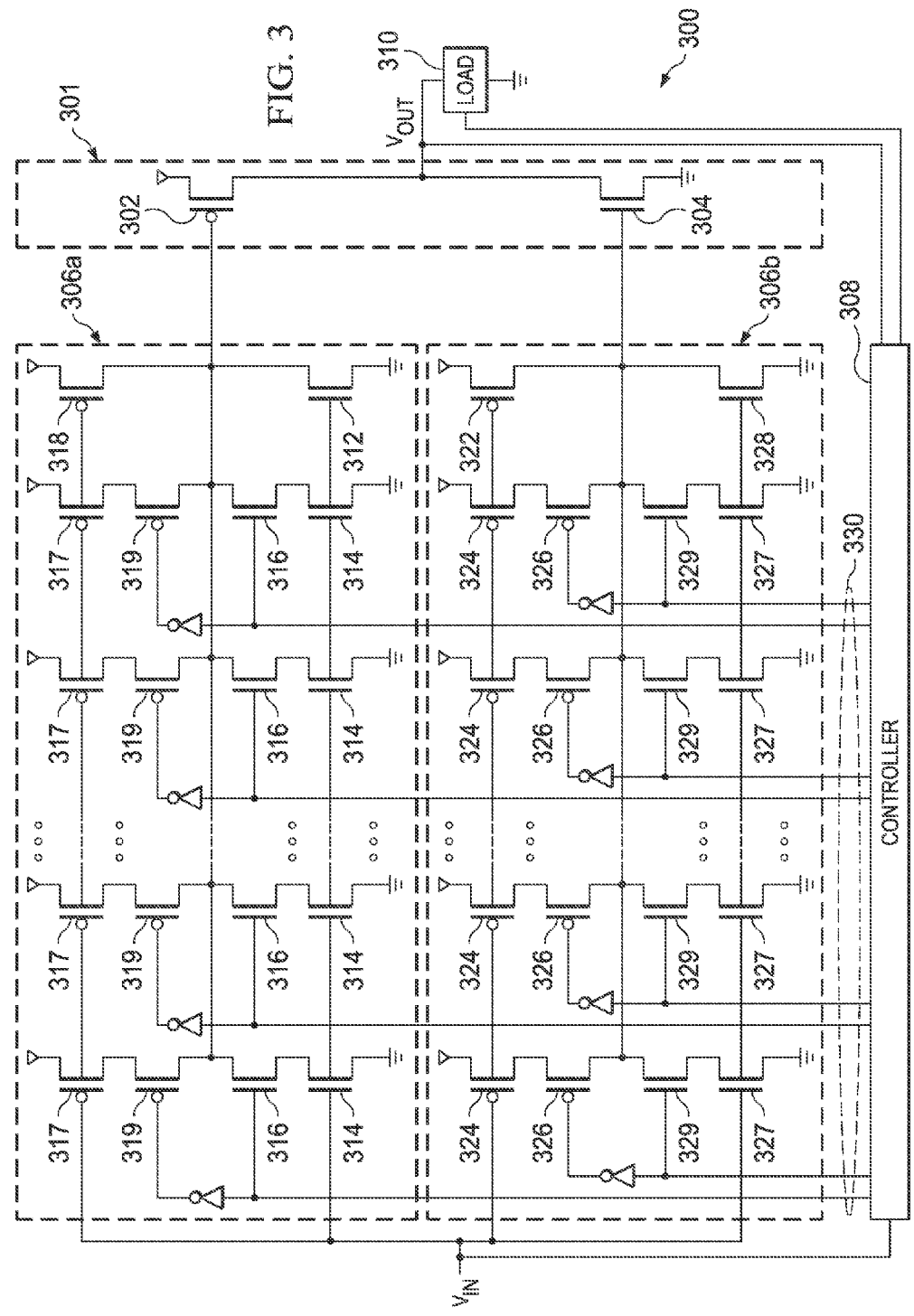
FIG. 3 illustrates an example circuit for reducing spike voltages in a switched output stage of a power converter, in accordance with embodiments of the present disclosure.

FIG. 3 illustrates an example circuit 300 for reducing spike voltages in a switched output stage 301 of a power converter, in accordance with embodiments of the present disclosure. Circuit 300 depicted in FIG. 3 comprises a switched output stage 301, two predriver circuits 306a and 306b, a controller 308, and a load 310.

Switched output stage 301 comprises a pull-up driver device 302 (implemented as a p-type metal-oxide-semiconductor field effect transistor in the embodiments represented by FIG. 3) coupled at its non-gate terminals between a supply voltage and an output node and a pull-down driver device 304 (implemented as an n-type metal-oxide-semiconductor field effect transistor in the embodiments represented by FIG. 3) coupled at its non-gate terminals between a ground voltage and the output node. Based on respective input voltage signals driven to their respective gates, pull-up driver device 302 and pull-down driver device 304 may drive an output voltage $v_{OUT}$ to load 310 which is a function of the respective input voltage signals. In some embodiments, switched output stage 301 may comprise at least a portion of an output stage of a power converter. In certain of such embodiments, such power converter may comprise a Class-D amplifier.

Predriver circuit 306a may receive an input signal $v_{IN}$ (e.g., a pulse-width-modulated voltage signal) and generate an input voltage signal to the gate terminal of pull-up driver device 302 which is a function of $v_{IN}$. As shown in FIG. 3, predriver circuit 306a may comprise a pull-up device 318

(implemented as a p-type metal-oxide-semiconductor field effect transistor in the embodiments represented by FIG. 3), a pull-down device 312 (implemented as an n-type metal-oxide-semiconductor field effect transistor in the embodiments represented by FIG. 3), one or more pairs of series-connected pull-down devices 314, 316 and one or more pairs of series connected pull-up devices 317, 319. Each pair of series-connected pull-down devices may be in parallel with pull-down device 312 and each such pair of series-connected pull-down devices may comprise an input-controlled pull-down device 314 (implemented as an n-type metal-oxide-semiconductor field effect transistor in the embodiments represented by FIG. 3) and a controller-controlled pull-down device 316 (implemented as an n-type metal-oxide-semiconductor field effect transistor in the embodiments represented by FIG. 3). Each input-controlled pull-down device 314 may be coupled to its associated controller-controlled pull-down device 316 such that when each of input-controlled pull-down device 314 and controller-controlled pull-down device 316 is turned on (e.g., has a gate terminal voltage exceeding its threshold voltage), such associated pull-down devices 314 and 316 provide a conductive path between the gate terminal of pull-up driver device 302 and a ground voltage.

Similarly, each pair of series-connected pull-up devices may be in parallel with pull-up device 318 and each such pair of series-connected pull-up devices may comprise an input-controlled pull-up device 317 (implemented as an p-type metal-oxide-semiconductor field effect transistor in the embodiments represented by FIG. 3) and a controller-controlled pull-up device 319 (implemented as an p-type metal-oxide-semiconductor field effect transistor in the embodiments represented by FIG. 3). Each input-controlled pull-up device 317 may be coupled to its associated controller-controlled pull-up device 319 such that when each of input-controlled pull-up device 317 and controller-controlled pull-up device 319 is turned on (e.g., has a gate terminal voltage below its threshold voltage), such associated pull-up devices 317 and 319 provide a conductive path between the gate terminal of pull-up driver device 302 and a supply voltage.

An input-controlled pull-down device 314 may be driven at its gate terminal by input signal $v_{IN}$ (or a derivative thereof) which may selectively turn on and turn off such input-controlled pull-down device 314. Similarly, an input-controlled pull-up device 317 may be driven at its gate terminal by input signal $v_{IN}$ (or a derivative thereof) which may selectively turn on and turn off such input-controlled pull-up device 317. Each controller-controlled pull-down device 316 and each controller-controlled pull-up device 319 may be driven at its gate terminal by a control signal 330 generated by controller 308 (or a derivative thereof, such as a logically inverted version thereof, for example), such that controller 308 may selectively enable and disable the various controller-controlled pull-down devices 316 and controller-controlled pull-up devices 319. Thus, pull-down devices 312, 314, and 316 create a pull circuit to drive the input voltage signal at the gate terminal of pull-up driver device 302 to a ground voltage, wherein the drive strength of the pull circuit is dependent upon which of controller-controlled pull-down devices 316 are enabled. In addition, pull-up devices 318, 317, and 319 create a pull circuit to drive the input voltage signal at the gate terminal of pull-up driver device 302 to a supply voltage, wherein the drive strength of the pull circuit is dependent upon which of controller-controlled pull-up devices 319 are enabled. Accordingly, the gate terminal of pull-up driver device 302 may have an effective impedance, wherein the effective impedance decreases as the drive strength increases, and vice versa.

Predriver circuit 306b may receive an input signal $v_{IN}$ (e.g., a pulse-width-modulated voltage signal) and generate an input voltage signal to the gate terminal of pull-down driver device 304 which is a function of $v_{IN}$. As shown in FIG. 3, predriver circuit 306b may comprise a pull-down device 328 (implemented as an n-type metal-oxide-semiconductor field effect transistor in the embodiments represented by FIG. 3), a pull-up device 322 (implemented as a p-type metal-oxide-semiconductor field effect transistor in the embodiments represented by FIG. 3), one or more pairs of series-connected pull-up devices 324, 326 and one or more pairs of series connected pull-down devices 327, 329. Each pair of series-connected pull-up devices may be in parallel with pull-up device 322 and each such pair of series-connected pull-up devices may comprise an input-controlled pull-up device 324 (implemented as a p-type metal-oxide-semiconductor field effect transistor in the embodiments represented by FIG. 3) and a controller-controlled pull-up device 326 (implemented as a p-type metal-oxide-semiconductor field effect transistor in the embodiments represented by FIG. 3). Each input-controlled pull-up device 324 may be coupled to its associated controller-controlled pull-up device 326 such that when each of input-controlled pull-up device 324 and controller-controlled pull-up device 326 is turned on (e.g., has a gate terminal voltage less than its threshold voltage), such associated pull-up devices 324 and 326 provide a conductive path between the gate terminal of pull-down driver device 304 and a supply voltage.

Similarly, each pair of series-connected pull-down devices may be in parallel with pull-down device 328 and each such pair of series-connected pull-down devices may comprise an input-controlled pull-down device 327 (implemented as an n-type metal-oxide-semiconductor field effect transistor in the embodiments represented by FIG. 3) and a controller-controlled pull-down device 329 (implemented as an n-type metal-oxide-semiconductor field effect transistor in the embodiments represented by FIG. 3). Each input-controlled pull-down device 327 may be coupled to its associated controller-controlled pull-down device 329 such that when each of input-controlled pull-down device 327 and controller-controlled pull-down device 329 is turned on (e.g., has a gate terminal voltage below its threshold voltage), such associated pull-down devices 327 and 329 provide a conductive path between the gate terminal of pull-down driver device 304 and a ground voltage.

An input-controlled pull-up device 324 may be driven at its gate terminal by input signal $v_{IN}$ (or a derivative thereof) which may selectively turn on and turn off such input-controlled pull-down device 324. Similarly, an input-controlled pull-down device 327 may be driven at its gate terminal by input signal $v_{IN}$ (or a derivative thereof) which may selectively turn on and turn off such input-controlled pull-down device 327. Each controller-controlled pull-up device 326 and each controller-controlled pull-down device 329 may be driven at its gate terminal by a control signal 330 generated by controller 308 (or a derivative thereof, such as a logically inverted version thereof, for example), such that controller 308 may selectively enable and disable the various controller-controlled pull-up devices 326 and controller-controlled pull-down devices 329. Thus, pull-up devices 322, 324, and 326 create a pull circuit to drive the input voltage signal at the gate terminal of pull-down driver device 304 to a supply voltage, wherein the drive strength of the pull circuit is dependent upon which of controller-controlled pull-up devices 326 are enabled. In addition, pull-down devices 328, 327, and 329 create a pull circuit to drive the input voltage signal at the gate terminal of pull-down driver device 304 to a ground voltage, wherein the drive strength of the pull circuit is dependent upon which of controller-controlled pull-down devices 329 are enabled. Accordingly, the gate terminal of pull-down driver device 304 may have an effective impedance, wherein the effective impedance decreases as the drive strength increases, and vice versa.

Controller 308 may comprise any system, device, or apparatus configured to, based on information indicating a characteristic of an output load current of switched output stage 301, selectively enable controller-controlled pull-down devices 316 and 329 and controller-controlled pull-up devices 319 and 326 via control signals 330 (or a derivative thereof, such as a logically inverted version thereof, for example), thus controlling the drive strength of predriver circuits 306a and 306b (and accordingly, the effective impedances of the gate terminals of pull-up driver device 302 and pull-down driver device 304) based on the characteristic of the output load current. Controller 308 may include, without limitation, a microprocessor, microcontroller, digital signal processor (DSP), application specific integrated circuit (ASIC), or any other digital or analog circuitry configured to perform the functionality of controller 308 as described herein.

In some embodiments, the characteristic of the output load current may comprise a magnitude of the output load current. In certain of such embodiments, controller 308 and one of predriver circuits 306a and 306b may be configured to select a particular effective impedance for a gate terminal of a driver device 302 or 304 based on the magnitude. In particular embodiments, one of predriver circuits 306a and 306b may be configured to select a particular effective impedance of the gate terminal when the magnitude of the output load current exceeds a predetermined threshold current value. In these and other embodiments, the characteristic may comprise load configuration information associated with load 310 driven by the output load current. In certain of such embodiments, such load configuration information may include information regarding an impedance of load 310, and/or information regarding an identity of the load 310 (e.g., a digital variable indicative of a make and/or model of load 310). In these and other embodiments, the characteristic may comprise an overshoot amplitude of the output voltage $v_{OUT}$.

Load 310 may comprise any suitable load that may be driven by switched output stage 301, including, without limitation, an audio speaker.

Thus, in operation, a predriver circuit 306a or 306b may drive an input voltage signal to a corresponding gate terminal of a driver device 302 or 304, and may select a drive strength for the predriver circuit 306a or 306b (and thus an effective impedance of its corresponding gate terminal) based on an input for indicating a characteristic of the output load current (e.g., magnitude, load configuration information, overshoot amplitude, etc.).

Figure 1:
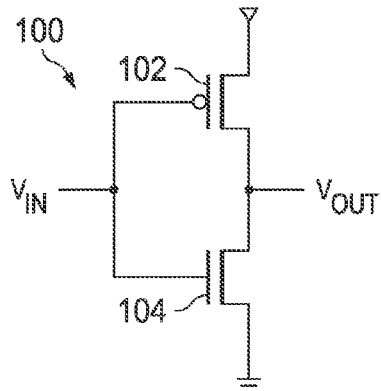
FIG. 1 illustrates a switched output stage for a power converter, as is known in the art.
Figure 2:
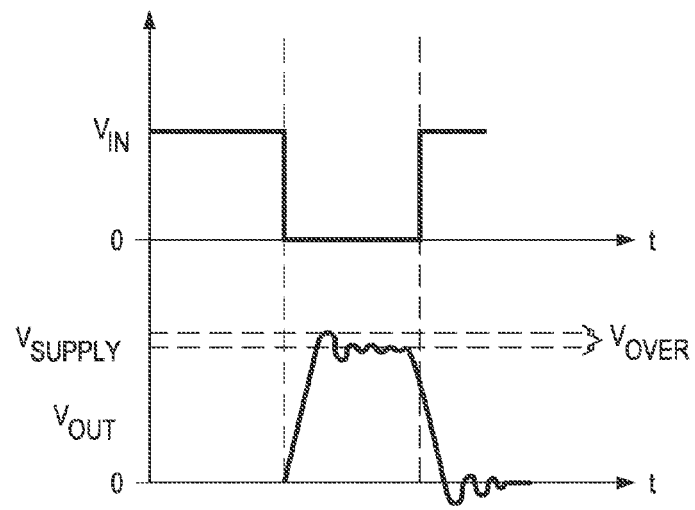
FIG. 2 illustrates example voltage and current graphs associated with the switched output stage illustrated in FIG. 1, as is known in the art.
Figure 4:
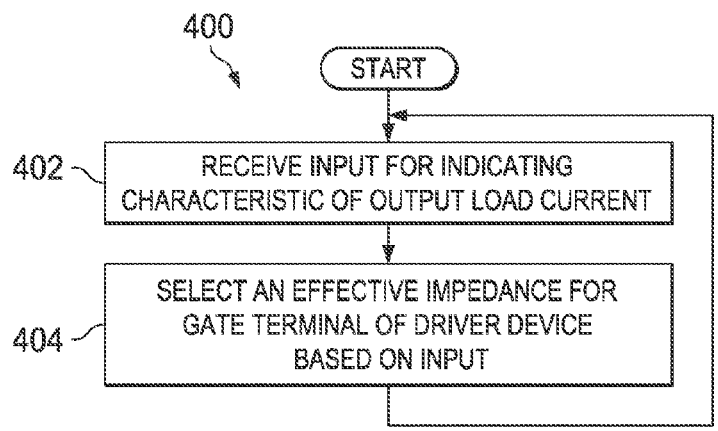
FIG. 4 illustrates a flow chart of an example method for reducing spike voltages in a switched output stage of a power converter, in accordance with embodiments of the present disclosure.

FIG. 4 illustrates a flow chart of an example method 400 for reducing spike voltages in a switched output stage (e.g., switched output stage 301) of a power converter, in accordance with embodiments of the present disclosure. According to certain embodiments, method 400 may begin at step 402. As noted above, teachings of the present disclosure may be implemented in a variety of configurations of circuit 300. As such, the preferred initialization point for method 400 and the order of the steps 402 and 404 comprising method 400 may depend on the implementation chosen.

At step 402, a predriver circuit (e.g., predriver circuit 306a or 306b) for driving an input voltage signal to a gate terminal of a driver device (e.g., pull-up driver device 302 or pull-down driver device 304) may receive an input for indicating a characteristic of an output load current of a switched output stage comprising the driver device. The characteristic may comprise a magnitude of the output load current, load configuration information (e.g., load impedance) of a load driven by the output load current, overshoot amplitude of the output voltage $v_{OUT}$, etc.

At step 404, the predriver circuit may select an effective impedance of the gate terminal of the driver device based on the input for indicating the output load current. In some embodiments, the predriver circuit may select the effective impedance by selecting a drive strength of a pull circuit for driving the input voltage signal to at least one of a supply voltage and a ground voltage, wherein the drive strength is based on the input for indicating the output load current, and the effective impedance is based on the drive strength. After completion of step 404, method 400 may proceed again to step 402.

Although FIG. 4 discloses a particular number of steps to be taken with respect to method 400, method 400 may be executed with greater or fewer steps than those depicted in FIG. 4. In addition, although FIG. 4 discloses a certain order of steps to be taken with respect to method 400, the steps comprising method 400 may be completed in any suitable order.

Method 400 may be implemented using controller 308, predriver circuit 306a, predriver circuit 306b, and/or any other system operable to implement method 400. In certain embodiments, method 400 may be implemented partially or fully in software and/or firmware embodied in computer-readable media.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An apparatus, comprising:
   an input for indicating a characteristic of an output load current of a switched output stage comprising at least one driver device; and
   a predriver circuit coupled to the input and a gate terminal of the at least one driver device, the predriver circuit for driving an input voltage signal to the gate terminal and configured to select an effective impedance of the gate terminal based on the input for indicating the characteristic.

2. The apparatus of claim 1, wherein:
the predriver circuit comprises a pull circuit to drive the input voltage signal to at least one of a supply voltage and a ground voltage;
the predriver circuit is configured to select a drive strength of the pull circuit based on the input for indicating the characteristic; and
the effective impedance is based on the drive strength.

3. The apparatus of claim 1, wherein the characteristic comprises a magnitude of the output load current.

4. The apparatus of claim 3, wherein the predriver circuit is configured to select a particular effective impedance of the gate terminal when the magnitude of the output load current exceeds a predetermined threshold current value.

5. The apparatus of claim 1, wherein the characteristic comprises load configuration information associated with a load driven by the output load current.

6. The apparatus of claim 5, wherein the load configuration information comprises information regarding an impedance of the load.

7. The apparatus of claim 1, wherein the characteristic comprises an overshoot amplitude of an output voltage driving the output load current.

8. The apparatus of claim 1, wherein the driver device comprises at least a portion of an output stage of a power converter.

9. The apparatus of claim 8, wherein the driver device comprises at least a portion of an output stage of a Class-D amplifier.

10. A method, comprising:
receiving an input for indicating a characteristic of an output load current of a switched output stage comprising at least one driver device; and
selecting an effective impedance of a gate terminal of the at least one driver device based on the input for indicating the output load current.

11. The method of claim 10, further comprising selecting a drive strength of a pull circuit based on the input for indicating the output load current, wherein the pull circuit is configured to drive the input voltage signal to at least one of a supply voltage and a ground voltage and the effective impedance is based on the drive strength.

12. The method of claim 10, wherein the characteristic comprises a magnitude of the output load current.

13. The method of claim 12, further comprising selecting a particular effective impedance of the gate terminal when the magnitude of the output load current exceeds a predetermined threshold current value.

14. The method of claim 10, wherein the characteristic comprises load configuration information associated with a load driven by the output load current.

15. The method of claim 14, wherein the load configuration information includes information regarding an impedance of the load.

16. The method of claim 10, wherein the characteristic comprises an overshoot amplitude of an output voltage driving the output load current.

17. The method of claim 10, wherein the driver device comprises at least a portion of an output stage of a power converter.

18. The method of claim 17, wherein the driver device comprises at least a portion of an output stage of a Class-D amplifier.

* * * * *